United States Patent [19]
Sato et al.

[11] Patent Number: 4,837,741
[45] Date of Patent: Jun. 6, 1989

[54] MAGNETIC BUBBLE MEMORY DEVICE

[75] Inventors: Toshihiro Sato, Kokubunji; Takashi Toyooka, Sayama; Naoki Kodama, Tachikawa; Teruaki Takeuchi, Koganei; Masatoshi Takeshita, Hachioji; Ryo Suzuki, Hachioji, all of Japan

[73] Assignee: Hitachi, Ltd., Tokyo, Japan

[21] Appl. No.: 46,170

[22] Filed: May 5, 1987

[30] Foreign Application Priority Data

May 9, 1986 [JP] Japan ............................ 61-104644

[51] Int. Cl.$^4$ .............................................. G11C 19/08
[52] U.S. Cl. .................................... 365/12; 365/36
[58] Field of Search ................................ 365/12, 36

[56] References Cited
FOREIGN PATENT DOCUMENTS

| 2562706 | 10/1985 | France | 365/36 |
| 0166586 | 10/1983 | Japan | 365/36 |
| 0058685 | 4/1984 | Japan | 365/12 |

Primary Examiner—James W. Moffitt
Attorney, Agent, or Firm—Antonelli, Terry & Wands

[57] ABSTRACT

In a magnetic bubble memory device in which a major line and minor loops are constituted by ion-implanted tracks, a gate is constituted having two functions, i.e., having a replicate function and a pseudo swap function using conductor patterns of two layers that overlap on both the major line and on the minor loops. By controlling the pulsed current supplied to the conductor patterns of the two layers, the replicate function divides the bubble in the minor loop into two bubbles, so that one of the bubbles is taken onto the major line and is propagated to the detector. The pseudo swap function annihilates the bubble in the minor loop, divides the bubble on the major line into two bubbles and introduces one of them into the minor loop, thereby to realize the same function as that of the conventional swap gate.

16 Claims, 9 Drawing Sheets

MAGNETIC BUBBLE MEMORY DEVICE

BACKGROUND OF THE INVENTION

1. Field of the Invention

The present invention relates to a magnetic bubble memory device having functions using ion-implanted tracks and conductor patterns, and relates more particularly to functions of a block replicate gate and a swap gate.

2. Description of the Related Art

A magnetic bubble memory device having functions using ion-implanted tracks and conductor patterns has been disclosed, for example, in IEEE, Trans. Magnetics, MAG 20, 1984, pp. 1072–1074. The memory device has a major=minor loop structure as shown in FIG. 1, wherein a gate 6 between a major loop 2 and a minor loop 5 has only transfer-out and transfer-in functions to output and input magnetic bubbles, respectively. A memory device employing permalloy tracks shown in FIG. 2, on the other hand, has a block replicate gate 7 which divides the magnetic bubble in the minor loop 5 into two bubbles and takes them out onto a read major line 10, and has a swap gate 8 which exchanges the magnetic bubbles in the minor loop 5 with the magnetic bubbles on a write major line 9. The two kinds of the gates make it possible to greatly reduce the cycle time in read and write operation.

With reference to the block replicate gate 7 of FIG. 2, adesign has been proposed in which upper and lower conductor patterns are formed on the ion-implanted tracks as shown in Trans., Magnetics, MAG–20, 1982, pp. 1087–1089. With reference to the swap gate 8, there has been proposed a design employing a single layer conductor as disclosed, for example, in Japanese Patent Laid-Open No. 155590/1983. However, two problems arise as described below if the memory chip architecture as shown in FIG. 3 is used. In the architecture, the two kinds of gates are connected to the upper and lower corners in the minor loop and are also connected to the write major line and to the read major line, respectively. The first problem is that either the write major line 9 or the read major line 10 has poor bubble propagation characteristics. The problem comes from the fact that the easy magnetic axis of the ion-implanted layer has a three fold symmetry. The second problem is that the two major lines have bubble propagation directions that are opposite to each other as designated at 11 and 12 in FIG. 3. Therefore, the output data stream in the read operation is the inverted data stream of the input data stream in the read operation.

No system has yet been proposed that is effective to solve these two problems. The memory device having ion-implanted functions of both the block replicate gate and the swap gate has not yet been realized, which results in no compatibility to the existing permalloy devices.

SUMMARY OF THE INVENTION

The object of the present invention is to provide a magnetic bubble memory device having compatibility to the permalloy devices, and also having ion-implanted functions.

The above-mentioned object is achieved by a magnetic bubble memory device having a plurality of minor loops composed of ion-implanted tracks and a major line for write and read-operation which is also composed of ion-implanted tracks that have a bubble propagation direction nearly perpendicular to the magnetic bubble propagation direction of the minor loops, using gates having structure in which a first hair-pin conductor pattern formed in a first conductor layer and a second hair-pin conductor pattern formed in a second conductor layer are ovelapped both on the ends of the minor loop tracks and on the major line.

In the operation as a block replicate gate, a pulsed current is supplied to the first hair-pin conductor pattern so that the magnetic bubble in the minor loop stretches in the hair-pin portion and then the pulsed current is supplied to the second hair-pin conductor pattern to divided the stretched magnetic bubble into two bubbles. One of the divided magnetic bubbles remains in the minor loop and the other magnetic bubble propagates onto the major line. In the operation as the pseudo swap gate, the pulsed current is supplied to the second conductor pattern to annihilate the magnetic bubbles in the minor loop and then the pulsed current is supplied to the first conductor pattern so that the magnetic bubble stretches onto the major line. Then, by supplying the pulsed current into the second conductor pattern the streched magnetic bubble is divided into two; one of the magnetic bubbles remaining on the major line and the other being propagated into the minor loop. The pseudo swap function makes it possible to obtain the same function as that of the swap gate in the conventional permalloy device.

By using the first conductor pattern which stretches the magnetic bubble and the second conductor pattern which divides and annihilates the magnetic bubble, as described above, operations of the block replicate and of the pseudo swap can be realized with a single functional gate.

BRIEF DECRIPTION OF THE DRAWINGS

Figure 8:
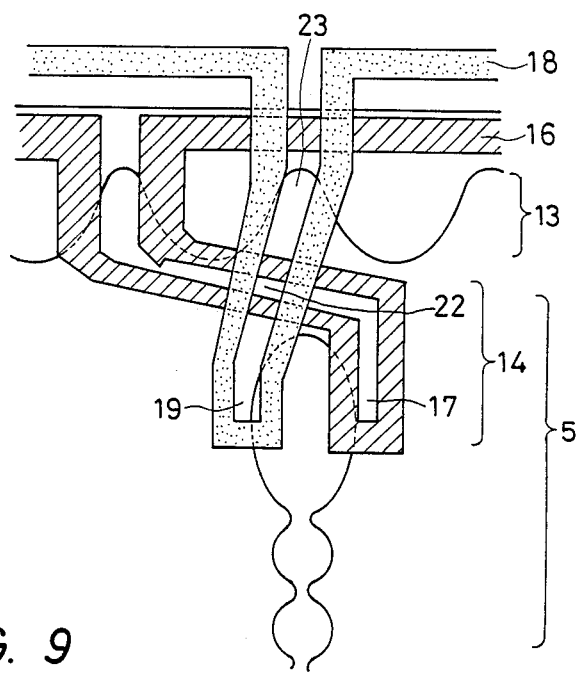
Figure 9:
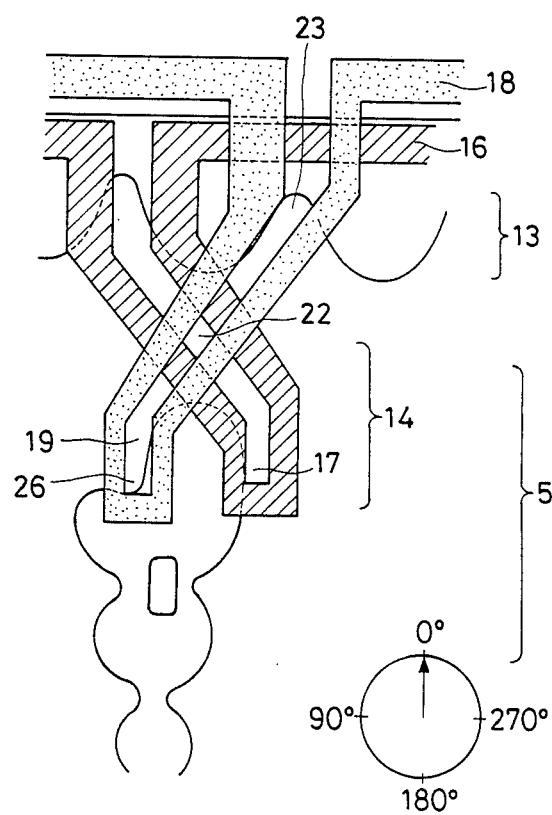
Figure 10:
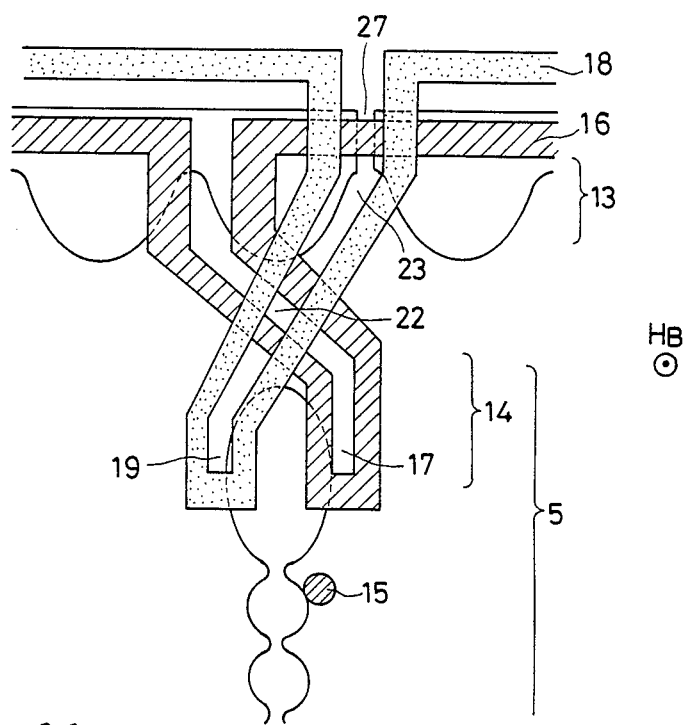
Figure 11:
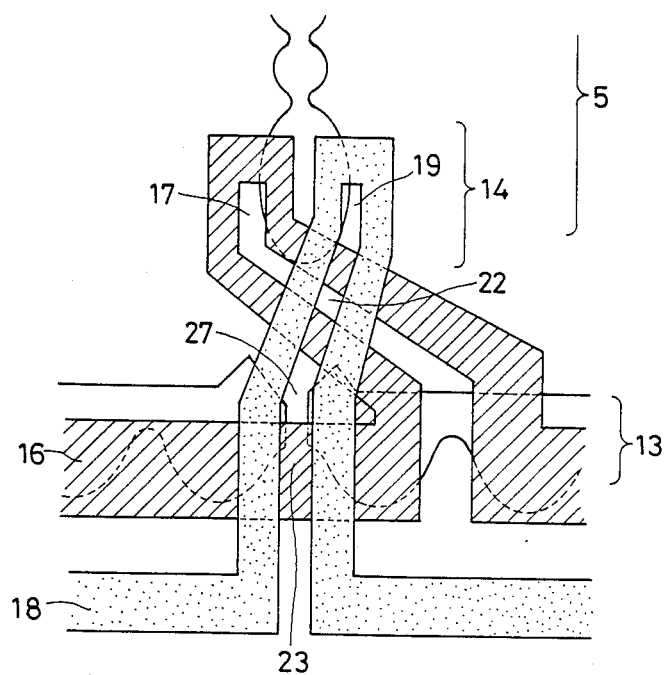
Figure 12:
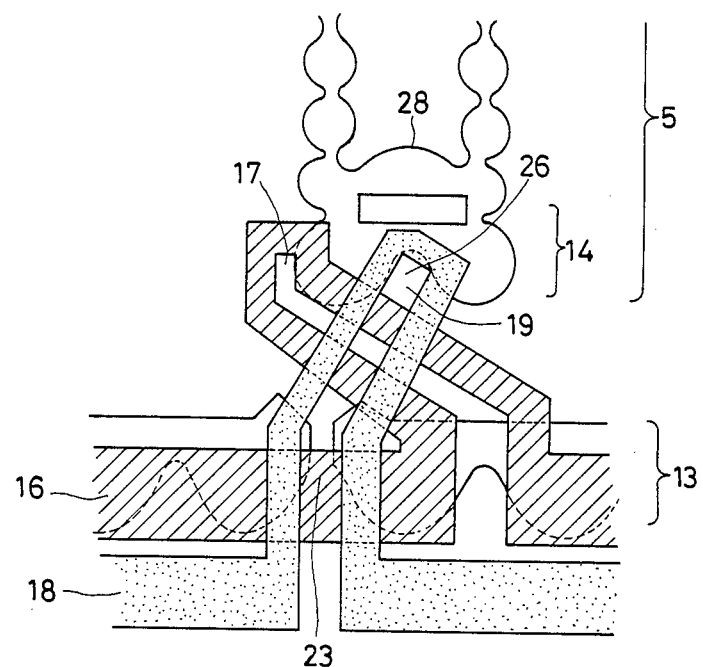
Figure 13:
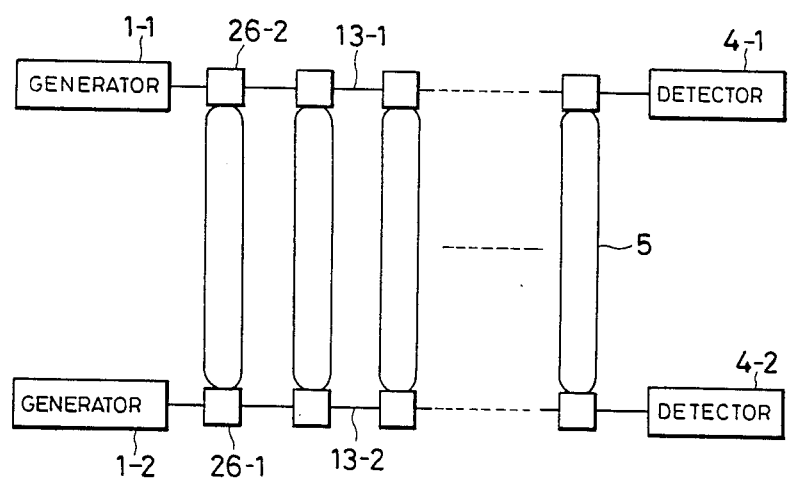

FIG. 6(a)–6(d) show the block replicate operation of the gate according to the ,first embodiment of the present invention;

FIGS. 7(a)–7(d) show the pseudo swap operation of the gate according to the first embodiment of the present invention;

FIG. 8 shows the gate according to a second embodiment of the present invention;

FIG. 9 shows the gate according to a third embodiment of the present invention;

FIG. 10 shows the gate according to a fourth embodiment of the present invention;

FIG. 11 shows the gate according to a fifth embodiment of the present invention;

FIG. 12 shows the gate according to a sixth embodiment of the present invention; and FIG. 13 shows the memory chip architecture according to a seventh embodiment of the present invention.

DETAILED DESCRIPTION OF THE PREFERRED EMBODIMENTS

Preferred embodiments of the present invention will now described with reference to the accompanying drawings.

Figure 1:
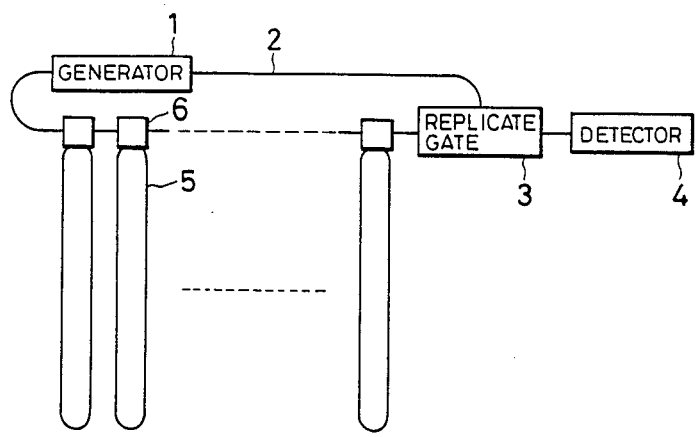
FIG. 1 shows one of the conventional architectures of the magnetic bubble memory device composed of minor loops and a major line composed of ion-implanted tracks.
Figure 2:
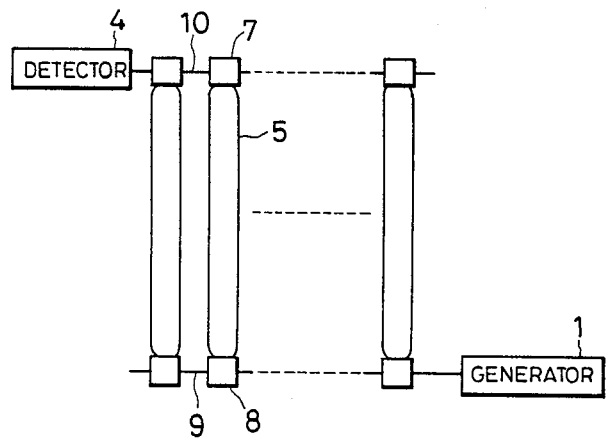
FIG. 2 shows one of the conventional architectures of the magnetic bubble memory device using permalloy tracks.
Figure 3:
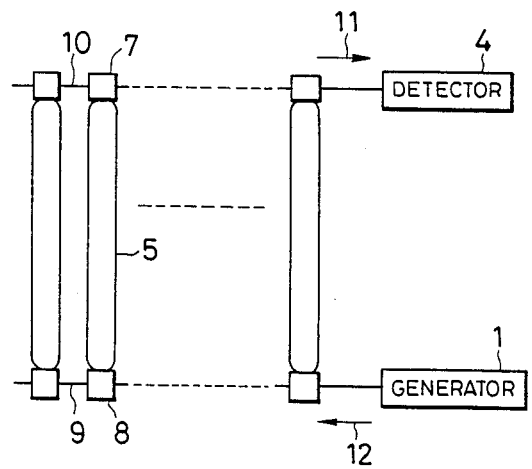
FIG. 3 shows a magnetic bubble memory device architecture using ion-implanted tracks for two major lines and minor loops.
Figure 4:
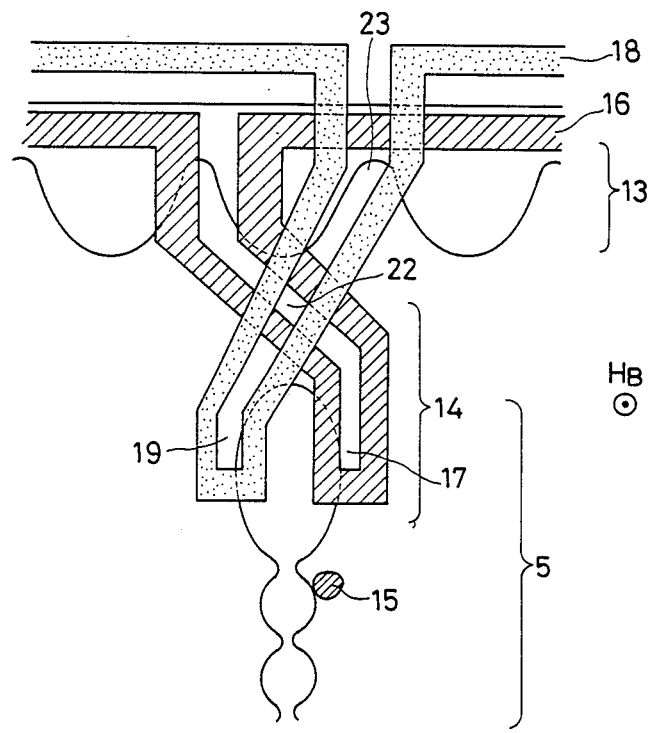
FIG. 4 shows the block replicate and pseudo swap gate according to a first embodiment of the present invention.
Figure 5:
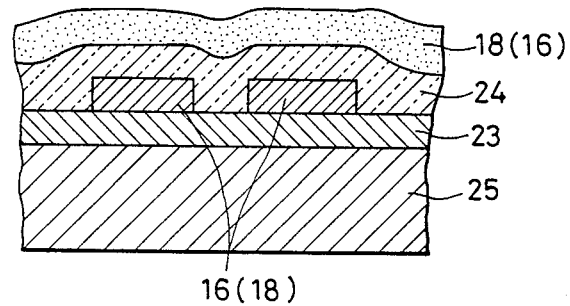
FIG. 5 is the cross sectional view of the block replicate and pseudo swap gate with two level conductor patterns.

FIG. 4 illustrates a first embodiment of the present invention. A minor loop 5 and a major line 13 are formed by an edge between an ion-implanted region and an unimplanted region. On the ion-implanted layer, are formed a first hair-pin conductor pattern 16 and a second hair-pin conductor pattern 18 that are superposed on both the minor loop 5 and the major line 13. Gaps 17 and 19 of the two hair-pin conductor patterns 16 and 18 intersect at a position 22 in FIG. 4. The gap 17 of the first hair-pin conductor pattern 16 is arranged on a cusp 23 on the major line 13. Further, the two hair-pin conductor patterns 16 and 18 are arranged close to the out-side turn 14 which compose an end of the minor loop 5. FIG. 5 shows the cross sectional view of the gate. A first insulating layer 23 is formed on a bubble magnetic garnet film 25 which holds the bubble, and the first hair-pin conductor pattern 16 is formed thereon. Further, a second insulating layer 24 is formed, and the second, hair-pin conductor pattern 18 is formed thereon so that the first and second hair-pin conductor patterns are electrically isolated from one another by the insulating layer 24 and disposed at different levels. Here, the positions of the first and second hair-pin conductor patterns 16 and 18 may be reversed as indicated by numerals in parentheses in FIG. 5.

Th block replicate and pseudo swap operations of the gate will now be described in conjunction with FIGS. 6 and 7. In FIGS. 6 and 7, the phase $\theta$ of the rotating field HR is presumed to be 0° in the upper direction. Further, the magnetic bias field $H_B$ is applied in the perpendicular direction from the back side toward the front side of the paper. When the bias field is applied, the bubble has a magnetic S pole at its upper surface.

Figure 6A:
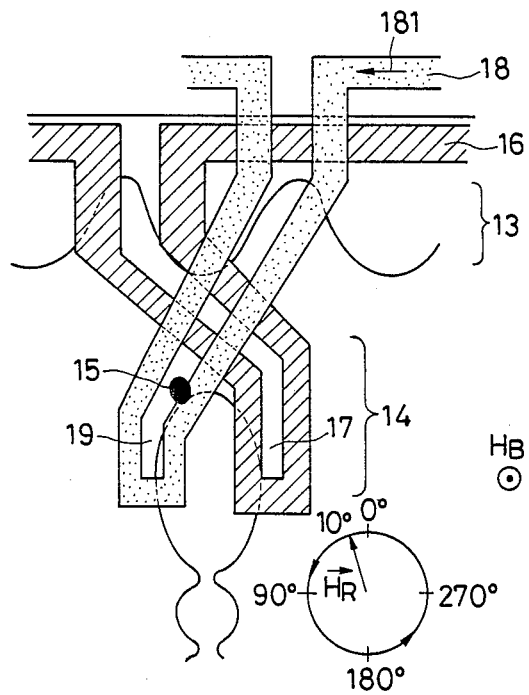
Figure 6B:
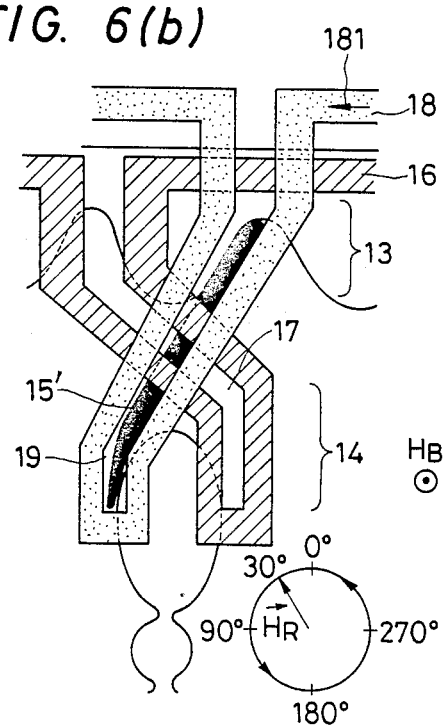
Figure 6C:
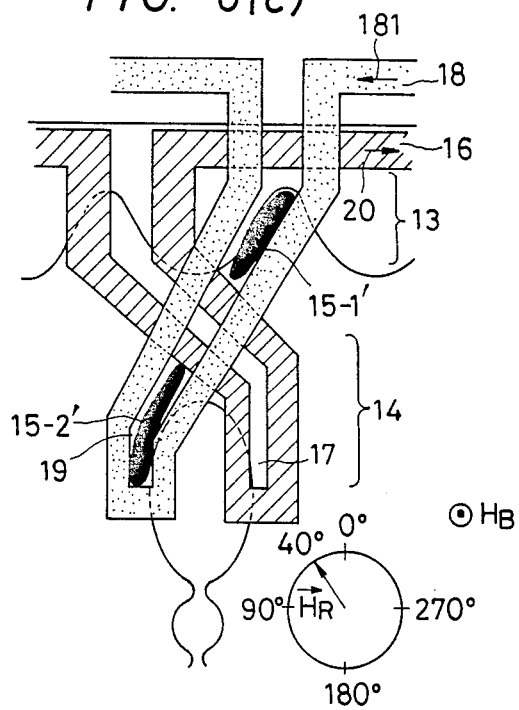
Figure 6D:
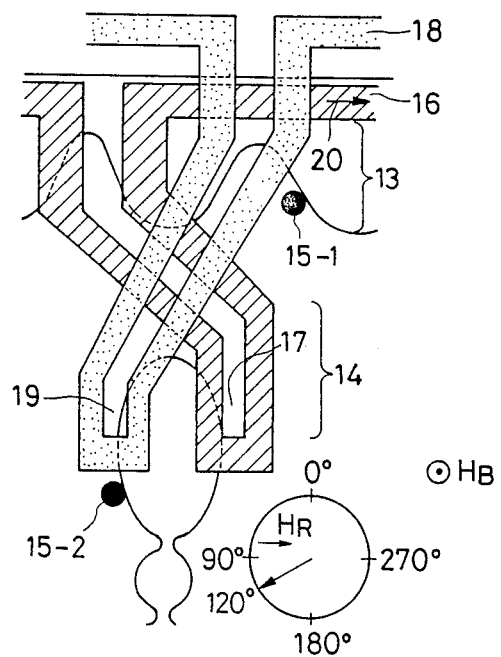

The block replicate function will first be described in conjunction with FIGS. 6(a) to 6(d). In the following operation, the rotating field frequency is presumed to be 100 KHz. When the drive field $H_R$ is in the direction of 10° as shown in FIG. 6(a), a magnetic bubble 15 on the out-side turn 14 of the minor loop 5 is positioned in the gap 19 of the second hair-pin conductor pattern 18. In the drive field phase, a pulsed current (having an amplitude of about 60 mA and a width of 2 $\mu$s) in a direction indicated by the arrow 181 is supplied to the hair-pin conductor pattern 18 to decrease the bias field in the gap 19. The magnetic bubble is then stretched in the gap 19 of the hair-pin conductor pattern 18 to form a strip domain 15' as shown in FIG. 6(b). In the drive field direction $\theta$ of 40° shown in FIG. 6(c), a pulsed current (having an amplitude of about 200 mA and a width of 0.2 $\mu$s) in the direction indicated by the arrow 20 is supplied to the first hair-pin conductor pattern 16 in order to increase the bias field in the gap 17 and to divide the strip domain 15' into two strip domains 15-1' and 15-2' as shown in FIG. 6(c). After the pulsed current is removed, the divided strip domains 15-1' and 15-2' shrinks to be circular bubble domains 15-1 and 15-2 (FIG. 6(d)). As the rotating field is further driven, the bubble domain 15-1 propagates on the major line 13 and the bubble domain 15-2 propagates on the minor loop 5. By the above-mentioned operation, a copy of the magnetic bubble 15 in the minor loop 5 can be formed on the major line 13. By propagating the bubbles on the major line 13 up to the detector and activating the detector the non-destructive read operation is realized.

Figure 7A:
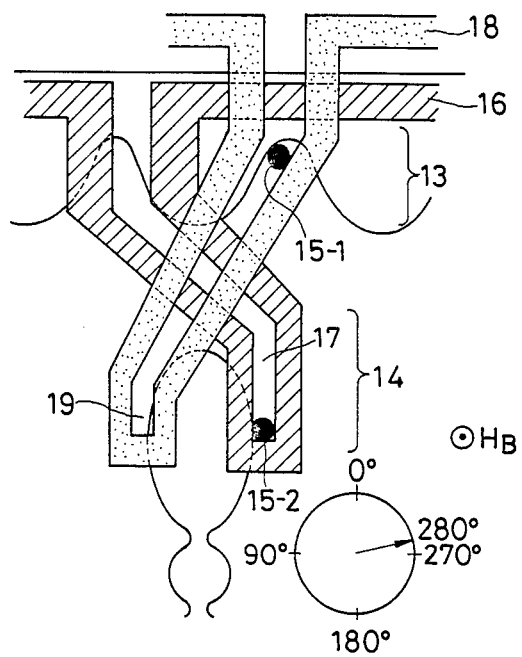
Figure 7B:
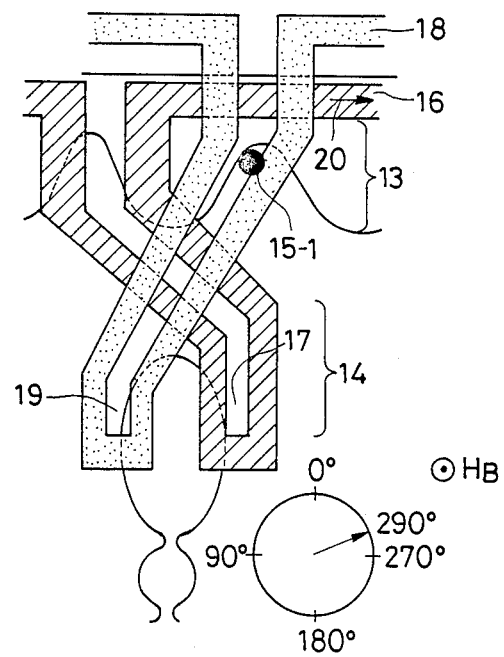
Figure 7C:
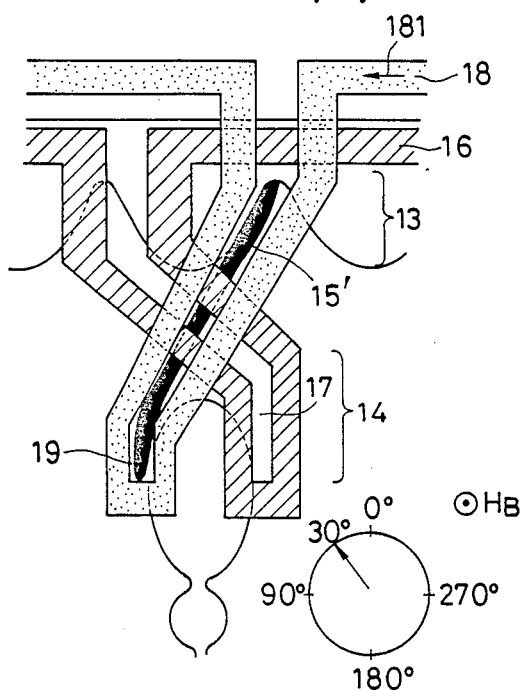

The pseudo-swap operation will now be described with reference to FIGS. 2-7(a) to 7(d). In the drive field phase $\theta$ of 280°, the magnetic bubble 15-2 on the out-side turn 14 of the minor loop 5 is located in the gap 17 of the first hair-pin conductor 16 as shown in FIG. 7(a). On the other hand, on the major line 13 is located a magnetic bubble 15-1 that corresponds to a write data pattern generated by the generator 1. When the phase $\theta$ is 280°, the magnetic bubble 15-1 is located on the cusp on the major line. When the phase $\theta$ is 290°, a pulsed current (having an amplitude of 100 mA and a width of 0.5 $\mu$s) in the direction indicated by the arrow 20 is supplied to the first hair-pin conductor pattern 16 as shown in FIG. 7(b), to annihilate the magnetic bubble 15-2. When the phase $\theta$ is 30°, a pulsed current (having an amplitude of 60 mA and a width of 3 $\mu$s) of a direction of the arrow 181 is supplied to the second hair-pin conductor pattern 18 as shown in FIG. 7(c) to decrease the bias field in the gap 19 and, therefore, to stretch the magnetic bubble 15-1 on the major line 13 to form a strip domain 15'.

Figure 7D:
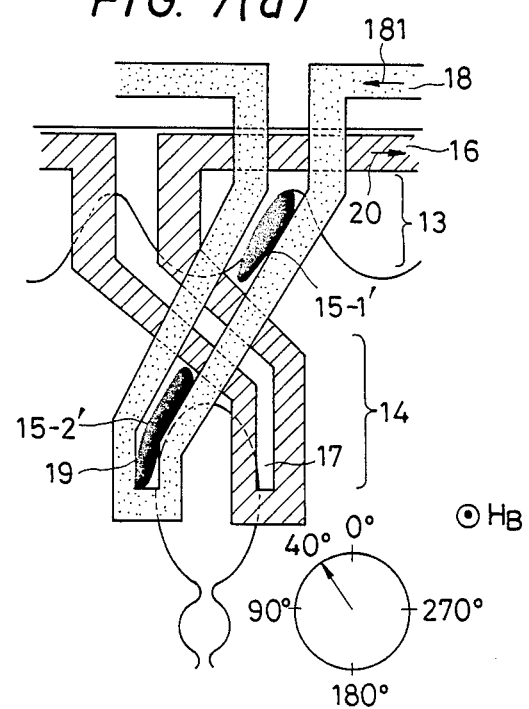

At $\theta = 40°$, a pulsed current of a direction indicated by the arrow 20 is supplied to the first hair-pin conductor pattern 18, to increase the bias field in the gap 17 and to divide the strip domain 15' into two strip domains 15-1' and 15-2' as shown in FIG. 7(d). when the pulsed current is removed, the two strip domains become circular magnetic domains. As the rotating field is further driven, the magnetic bubble 15-2' propagates in the minor loop 5, and the magnetic bubble 15-1' propagates on the major line 13. The magnetic bubble 15-1' propagates to a guardrail (not shown) through the major line 13, and is annihilated.

In the above-mentioned operation, the bubble in the minor loop 5 is annihilated, and a copy of a bubble stream generated by the generator 1 can be transferred in to the minor loop 5. The pseudo-swap function makes it possible to obtain a function that is substantially the same as that of the swap gate in the conventional permalloy devices.

By using the above-mentioned gate with the block replicate function and the pseudo swap function, single major line - minor loops architecture in which both the major line and the minor loops have good bubble propagation charateristics is realized in place of conventional permalloy architectures.

FIG. 8 illustrates a second embodiment of the present invention. In the first embodiment, the end of the out-side turn 14 of the minor loop 5 was arranged close to the tip of the major line 13. In this embodiment, however, the end of the out-side turn 14 is arranged close to the cusp 23 of the major line 13. The major line 13 and the out-side turn 14 have nearly the same shapes as those of the first embodiment. Positions of the first and second hair-pin conductor patterns 16 and 18 are partly modified, but relative positions of the out-side turn 14 of the minor loop 5 and the ends of the hair-pin conductors 16 and 18 are nearly the same as those of the first embodiment, and relative positions of the cusp 23 of the major line and the first and second hair-pin conductor patterns 16 and 18 are also nearly the same as those in the first embodiment.

This configuration enables the second hair-pin conductor pattern 18 to be shortened. Therefore, the stretched length of the magnetic bubble is shorter, and a pulsed current supplied to the second hair-pin conductor pattern 18 to stretch the bubble has a smaller amplitude.

FIG. 9 illustrates a third embodiment. In this embodiment, a cusp 26 is located on the out-side turn 14, so that the gap 19 of the second hair-pin conductor 18 is superposed on the cusp 26. The magnetic bubble exists on the cusp 26 over a phase range of rotating magnetic field of from 90° to 350° as shown in FIG. 9. This makes it possible to have the wider phase margin of the current pulse that is supplied to the second conductor pattern 18 to stretch the magnetic bubble.

FIG. 10 shows a fourth embodiment in which a block replicate gate and a pseudo-swap gate are composed of the first and second hair-pin conductor patterns 16 and 18 which have nearly the same forms as those in the first embodiment and of the major line 13 with gap 27 and the out-side turn 14 of the minor loop 5. By placing a gap 27 on the major line 13, the intensity of the magnetic pole can be weakened at the cusp 23 on the major line. Therefore, a current pulse amplitude supplied to stretch the bubble in the gap 19 of the second hair-pin conductor pattern 18, can be decreased.

A fifth embodiment is shown in FIG. 11 in which a gap 27 is located near the cusp 23 on the major line 13. Through the gap 27, the bubble on the major line 13 is stretched by the second hair-pin conductor 18 onto the out-side turn 14 of the minor loop 5.

The bubble on the out-side turn 14 of the minor loop 5 is stretched onto the major line 13 through the gap 27. The bubble stretch through the gap 27 near the cusp 23 on the major line 13, enables the position of the minor loop 5 relative to the major line 13 to be reversed in comparison with that of FIG. 4.

FIG. 12 illustrates a sixth embodiment which is a combination of the fifth embodiment (FIG. 11) and the third embodiment (FIG. 9). A cusp 26 on the out-side turn 14 and the gap 19 of the second hair-pin conductor pattern 18 are superposed. In this embodiment, however, the out-side turn 14 exists near the inside turn 28. Like the embodiment of FIG. 11, the bubble 15 is stretched through the gap 23 on the major line 13.

A seventh embodiment is shown in FIG. 13 in which the first major line 13-1 and a minor loop 5 are connected by the block replicate/pseudo swap gate 26-1 of the first, second, third or fourth embodiment Further, the minor loop 5 and the second major line 13-2 on the other side of the first major line 13-1 are connected by the block replicate/pseudo swap gate 26-2 of the fifth or seventh embodiment. Generators 1-1, 1-2 and detectors 4-1, 4-2 are arranged on each of the two major lines 13-1 and 13-2, respectively, in order to reduce the write and read cycle times.

What is claimed is:

1. A magnetic bubble memory device comprising:
   at least one major line having ion-implanted tracks;
   a plurality of minor loops having ion-implanted tracks; and
   gate means having ion-implanted tracks and first and second conductor patterns electrically isolated from one another and disposed at different levels, the gate means enabling a block replicate function and a pseudo swap function, said gate means in the block replicate function dividing a bubble in one of the minor loops into two bubbles and enabling one of the two bubbles to propagate on the at least one major line and the other of the two bubbles to propagate in the one of the minor loops, the gate means in the pseudo swap function annihilating a bubble in one of the minor loops and dividing a bubble on the at least one major line into two bubbles for enabling one of the two bubbles to propagate on the at least one major line and the other of the two bubbles to propagate in the one of the minor loops.

2. A magnetic bubble memory device according to claim 1, wherein two major lines having ion-implanted tracks are provided.

3. A magnetic bubble memory device according to claim 1, wherein the first and second conductor patterns include a first hair-pin conductor pattern and a second hair-pin conductor pattern electrically isolated from the first hair-pin conductor pattern by insulating material, the gate means in the block replicate function dividing the bubble in the one of the minor loops into two bubbles by stretching the bubble through the first hair-pin conductor pattern and cutting the stretched bubble through the second hair-pin conductor pattern so that one of the two bubbles propagates on the at least one major line and the other of the two bubbles propagates in the one of the minor loops, the gate means in the psuedo swap function annihilating a bubble in the one of the minor loops and dividing the bubble on the at least one major line into two bubbles by stretching the bubble on the at least one major line through the first hair-pin conductor pattern and cutting the stretched bubble and annihilating the bubble in the one of the minor loop through the second hair-pin conductor pattern so that one of the divided two bubbles propagates on the at least one major line and the other of the divided two bubbles propagates in the one of the minor loops.

4. A magnetic bubble memory device according to claim 1, wherein each of the first and second conductor patterns extend from the at least one major line to the one of the minor loops and cross one another along at least a portion of the extension thereof.

5. A magnetic bubble memory device comprising:
   at least one major line having ion-implanted tracks;
   a plurality of minor loops having ion-implanted tracks; and
   gate means having ion-implanted tracks and first and second hair-pin conductor patterns electrically isolated from one another by an insulating material, each of the first and second hair-pin conductor patterns extending from the at least one major line to at least one of the minor loops and crossing one another during at least a portion of the extension thereof.

6. A magnetic bubble memory device according to claim 5, wherein the gate means enables a block replicate function and a pseudo swap function.

7. A magnetic bubble memory device according to claim 5, wherein at least one of the first and second hair-pin conductor patterns has a gap overlapping a cusp of the at least one major line.

8. A magnetic bubble memory device according to claim 5, wherein the first and second hair-pin conductor patterns have portions overlapping on ion-implanted edges of the at least one major line and the at least one of the minor loops.

9. A magnetic bubble memory device according to claim 5, wherein one of the first and second hair-pin conductor patterns enables annihilation of bubbles in the at least one of the minor loops and dividing of a stretched bubble into two bubbles, the other of the first and second hair-pin conductor patterns enabling stretching of a bubble.

10. A magnetic bubble memory device according to claim 5, wherein the at least one of the minor loops has an out-side turn located proximate to a tip of the at least one major line.

11. A magnetic bubble memory device according to claim 5, wherein the at least one of the minor loops has an out-side turn located proximate to a cusp of the at least one major line.

12. A magnetic bubble memory device according to claim 5, wherein one of the first and second hair-pin conductor patterns has a gap overlapping a cusp on an out-side turn of the at least one of the minor loops.

13. A magnetic bubble memory device according to claim 5, wherein the ion-implanted tracks for the at least one major line are composed of separate unimplanted regions.

14. A magnetic bubble memory device according to claim 5, wherein the ion-implanted tracks for the at least one major line are located on a side opposite to a side of unimplanted regions from an out-side turn of the at least one of the minor loops.

15. A magnetic bubble memory device according to claim 5, wherein adjacent minor loops have an in-side turn and the at least one of the minor loops has an out-side turn located close to the in-side turn of the adjacent minor loops.

16. A magnetic bubble memory device according to claim 5 wherein the first and second hair-pin conductor patterns cross one another at a position between the at least one of the minor loops and the at least one major line.

* * * * *